(12) United States Patent
Nakayama

(10) Patent No.: US 9,224,682 B2
(45) Date of Patent: Dec. 29, 2015

(54) SEMICONDUCTOR DEVICE

(71) Applicant: Renesas Electronics Corporation, Kawasaki-shi (JP)

(72) Inventor: Takashi Nakayama, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/639,018

(22) Filed: Mar. 4, 2015

(65) Prior Publication Data

US 2015/0270210 A1    Sep. 24, 2015

(30) Foreign Application Priority Data

Mar. 18, 2014   (JP) ................................. 2014-055009

(51) Int. Cl.
*H01L 29/40*   (2006.01)
*H01L 23/498*  (2006.01)
*H01L 23/00*   (2006.01)

(52) U.S. Cl.
CPC .......... *H01L 23/49838* (2013.01); *H01L 24/06* (2013.01); *H01L 24/49* (2013.01); *H01L 2224/04042* (2013.01); *H01L 2224/0612* (2013.01); *H01L 2224/0651* (2013.01); *H01L 2224/4917* (2013.01)

(58) Field of Classification Search
CPC ................. H01L 2224/32225; H01L 2224/97; H01L 2224/73265; H01L 2924/15311; H01L 2924/00; H01L 2224/48227; H01L 2224/4824; H01L 2924/00012; H01L 2224/16225; H01L 2224/73204; H01L 2224/73215
USPC .......................... 257/686, 777, 780, 781, 784; 438/107–109, 125–126, 617, 637, 667
See application file for complete search history.

(56) References Cited

U.S. PATENT DOCUMENTS 6,979,905 B2   12/2005   Nishida et al.

FOREIGN PATENT DOCUMENTS

| JP | H05-102222 A | 4/1993 |
| JP | 2008-177265 A | 7/2008 |
| JP | 4615189 B2 | 1/2011 |

*Primary Examiner* — Mark A Laurenzi
(74) *Attorney, Agent, or Firm* — McGinn IP Law Group, PLLC

(57) ABSTRACT

A semiconductor device includes a first semiconductor and second semiconductor chips mounted over a package substrate. The first semiconductor chip includes a plurality of first bonding pads which are arranged along one side of the first semiconductor chip. The second semiconductor chip includes a plurality of second bonding pads and at least one third bonding pad. The second bonding pads are arranged along one side of the second semiconductor chip and for coupling respectively to the first bonding pads by wire-bonding coupling. The at least one third bonding pad is for enabling relay coupling of a corresponding second bonding pad to at least one predetermined first bonding pad which is arranged along the second bonding pads and included in the first bonding pads without crossing another wire in the wire-bonding coupling.

9 Claims, 11 Drawing Sheets

SEMICONDUCTOR DEVICE

CROSS-REFERENCE TO RELATED APPLICATIONS

The disclosure of Japanese Patent Application No. 2014-055009 filed on Mar. 18, 2014 including the specification, drawings and abstract is incorporated herein by reference in its entirety.

The present invention relates to a semiconductor device, and more particularly, to a semiconductor device in which a plurality of semiconductor chips is mounted.

BACKGROUND

As a key technology for realizing reductions in size, weight, and thickness of electronic devices, various packaging technologies have so far been developed for semiconductor devices, in order to realize the high-density packaging of the semiconductor chips.

As a technology for the packaging structure of the semiconductor devices and for reducing the area necessary for packaging onto the motherboard, there is a pin insertion type package, such as DIP (Dual Inline Package). There have been developed a surface mount package (SOP (Small Outline Package)), with outer leads and also a package (BGA (Ball Grid Array)), in which outer output terminals are arranged in matrix on the lower surface of package.

As a technology for realizing the high-density packaging by reducing the area ratio of the package to the semiconductor chips, there have been made some attempts, such as narrow pitching of the outer output terminals by the minuteness of the substrate wiring and also reduction of the package size.

Further, there have been developed technologies, such as a multi-chip package and a chip-stacked package. In the multi-chip package, a plurality of semiconductor chips are gathered and packed in a single package. The chip-stacked package, as one kind of multi-chip package, has a plurality of semiconductor chips stacked therein for realizing the further high-density packaging. Of the multi-chip packages, a System In Package (SIP) has been developed, as one system which has realized the systematization by enclosing the plurality of semiconductor chips having different functions in a single package.

In this SIP technology, it is necessary to shape the wiring coupling between the chips for the reduction of the package, and there has been proposed a system for coupling the wiring using a relay member, to be called a silicon interposer (U.S. Pat. No. 4,615,189 and Japanese Unexamined Patent Publication No. Hei 5(1993)-102222).

However, if the relay member, such as a silicon interposer, is used, it causes a problem of increasing the cost in the designing and manufacturing of the relay member.

Japanese Unexamined Patent Publication No. 2008-177265 proposes a system for shaping the wiring coupling by providing relay members respectively between bonding pads and inner leads of a semiconductor device. For this relay member, there has been proposed a system for forming the member by stacking an electrically conducting layer on the surface of the semiconductor device. In this case, a problem is an increase in the cost of designing and manufacturing it.

SUMMARY

To solve the above problem, there is provided a semiconductor device which can easily achieve wiring coupling between chips using a simple structure.

Other tasks and new features will be obvious from the descriptions of the present specification and attached drawings.

According to an embodiment, there is provided a semiconductor device which includes a first semiconductor and second semiconductor chips mounted on a package substrate. The first semiconductor chip includes a plurality of first bonding pads which are arranged along one side of the first semiconductor chip. The second semiconductor chip includes a plurality of second bonding pads and at least one third bonding pad. The second bonding pads are arranged along one side of the second semiconductor chip and for coupling respectively to the first bonding pads by wire-bonding coupling. The at least one third bonding pad is for enabling relay coupling of a corresponding second bonding pad to at least one predetermined first bonding pad which is arranged along the second bonding pads and included in the first bonding pads without crossing another wire in the wire-bonding coupling.

According to an embodiment, the above structure easily enables the wiring coupling between the chips using a simple structure.

DETAILED DESCRIPTION

Figure 1:
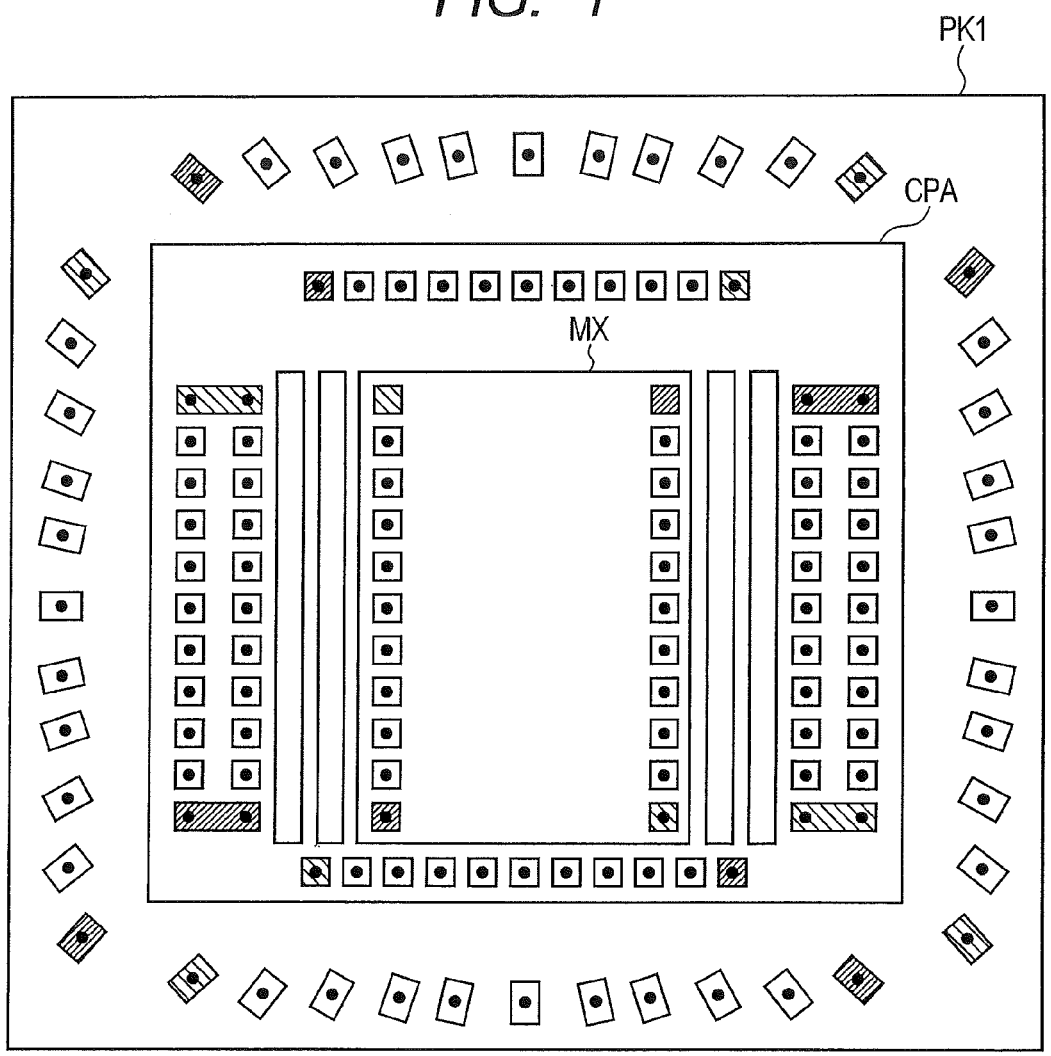
FIG. 1 is a diagram for explaining a structure of a semiconductor device 1 according to a First Embodiment.

Preferred embodiments of the present invention will now specifically be described with reference to the drawings. The same or corresponding parts in the drawings will be identified with the same reference numerals, and will not repeatedly be described.

First Embodiment

FIG. 1 is a diagram for explaining a structure of a semiconductor device 1 according to a First Embodiment.

In the illustration of FIG. 1, in this embodiment, the semiconductor device 1 is viewed from the upper surface. The semiconductor device 1 is a System In Package (SIP) with a plurality of semiconductor chips mounted thereon.

In this embodiment, descriptions will be made to a first semiconductor chip and a second semiconductor chip as the plurality of semiconductor chips by way of example. In this embodiment, the first semiconductor chip is a memory chip including a storage device. The second semiconductor chip is a logic chip including a logic circuit which executes a predetermined calculation process.

In this case, the semiconductor device 1 includes a package substrate PK1, a semiconductor chip CPA stacked on an upper layer of this package substrate PK1, and a semiconductor chip MX stacked on an upper layer of the semiconductor chip CPA.

In each of the package substrate PK1 and the semiconductor chips CPA and MX, a plurality of bonding pads PD are provided for wire-bonding coupling. The illustration is made on a state before the wire-bonding coupling is made.

Figure 2:
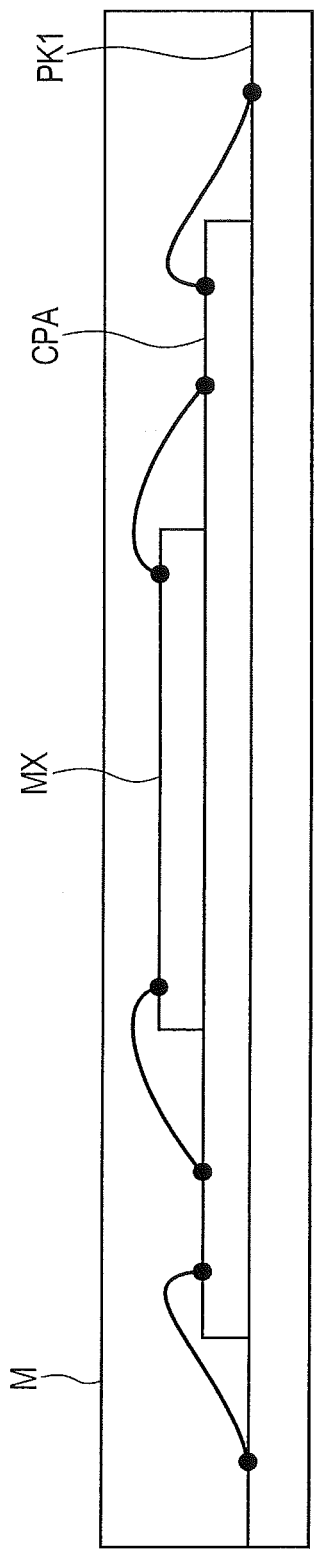
FIG. 2 is another diagram for explaining the structure of the semiconductor device 1 according to the First Embodiment.

FIG. 2 is another diagram for explaining a structure of the semiconductor device according to the First Embodiment. In the illustration of FIG. 2, in this embodiment, the semiconductor device 1 is viewed from the side surface.

The semiconductor device 1 includes a package substrate PK1, a semiconductor chip CPA stacked on an upper surface of this package substrate PK1, and a semiconductor chip MX stacked on an upper layer of the semiconductor chip CPA.

The package substrate PK1 and the semiconductor chip CPA are coupled by wire bonding. The semiconductor chip CPA and the semiconductor chip MX are coupled by wire bonding.

As a result, wiring coupling is achieved between the chips, thus enabling to realize a desired semiconductor device.

Figure 3:
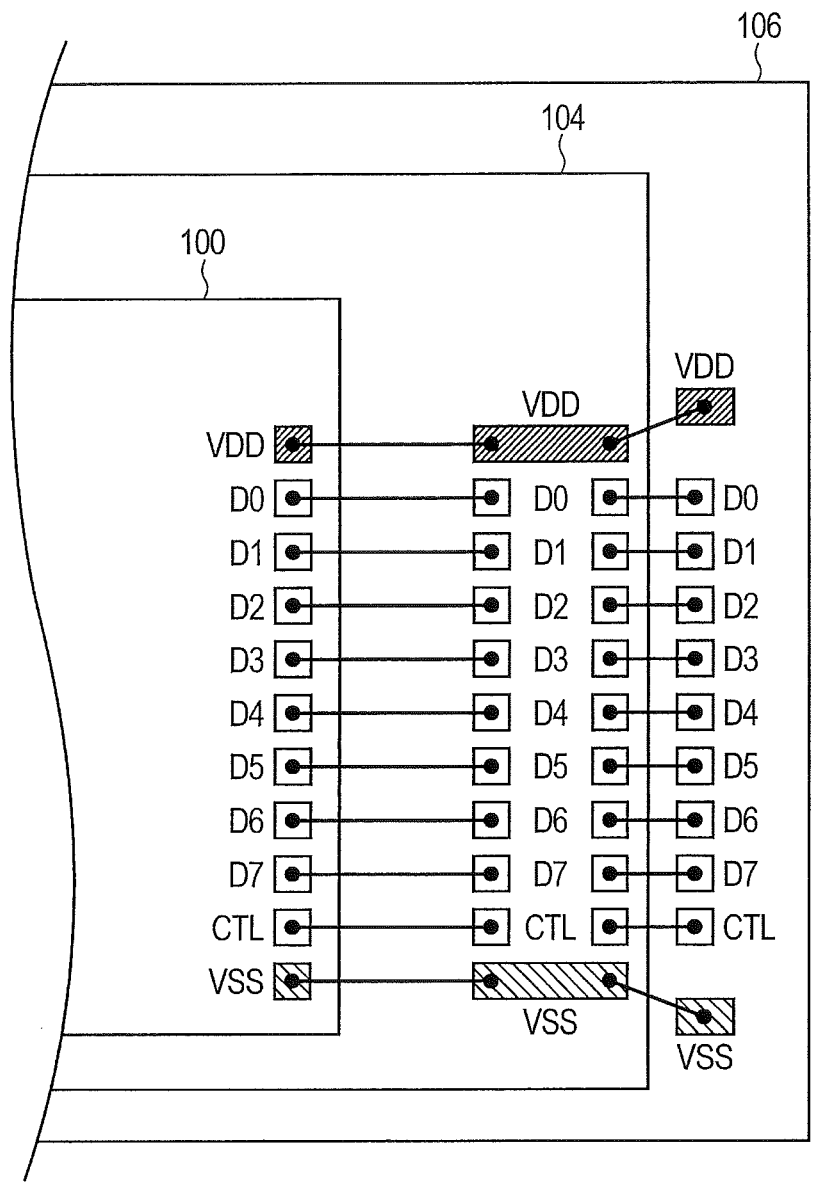
FIG. 3 is a diagram for explaining a semiconductor device as a comparative example 1 to be compared with the semiconductor device 1 according to the First Embodiment.

FIG. 3 is a diagram for explaining a semiconductor device as a comparative example 1 to be compared with the semiconductor device 1 according to the First Embodiment.

As illustrated in FIG. 3, a semiconductor chip 100 includes bonding pads PD for voltages VDD and VSS, data D0 to D7, and a control signal CTL.

Similarly, a semiconductor chip 104 and a package substrate 106 include bonding pads PD for voltages for voltages VDD and VSS, data D0 to D7, and a control signal CTL.

The wire-bonding coupling is a technique for coupling the corresponding bonding pads between the chips by wire (lead).

As illustrated in this embodiment, the semiconductor chip 104 has a plurality of bonding pads corresponding to the plurality of bonding pads of the semiconductor chip 100 which transmits and receives signals to and from other chips through wire bonding coupling. Further, the semiconductor chip 104 has a plurality of bonding pads corresponding to a plurality of bonding pads of the package substrate 106 which transmits and receives signals to and from other chips through wire bonding coupling.

The bonding pad corresponding to the signal D0 of the semiconductor chip and the bonding pad corresponding to the signal D0 of the semiconductor chip 104 are coupled by wire bonding. The bonding pad corresponding to the signal D0 of the semiconductor chip 104 and the bonding pad corresponding to the signal D0 of the package substrate 106 are coupled by wire bonding. The same applies to those bonding pads corresponding to other signals. In the illustrated case, the bonding pads corresponding to the voltages VDD and VSS are shared in the semiconductor chip 104.

In the illustrated case, the same signal array of the bonding pads PD is applied in the semiconductor chip 100, the semiconductor chip 104, and the package substrate 106.

In this structure, the plurality of wires for the wire-bonding coupling enable the coupling of the opposed corresponding bonding pads without crossing each other.

Figure 4:
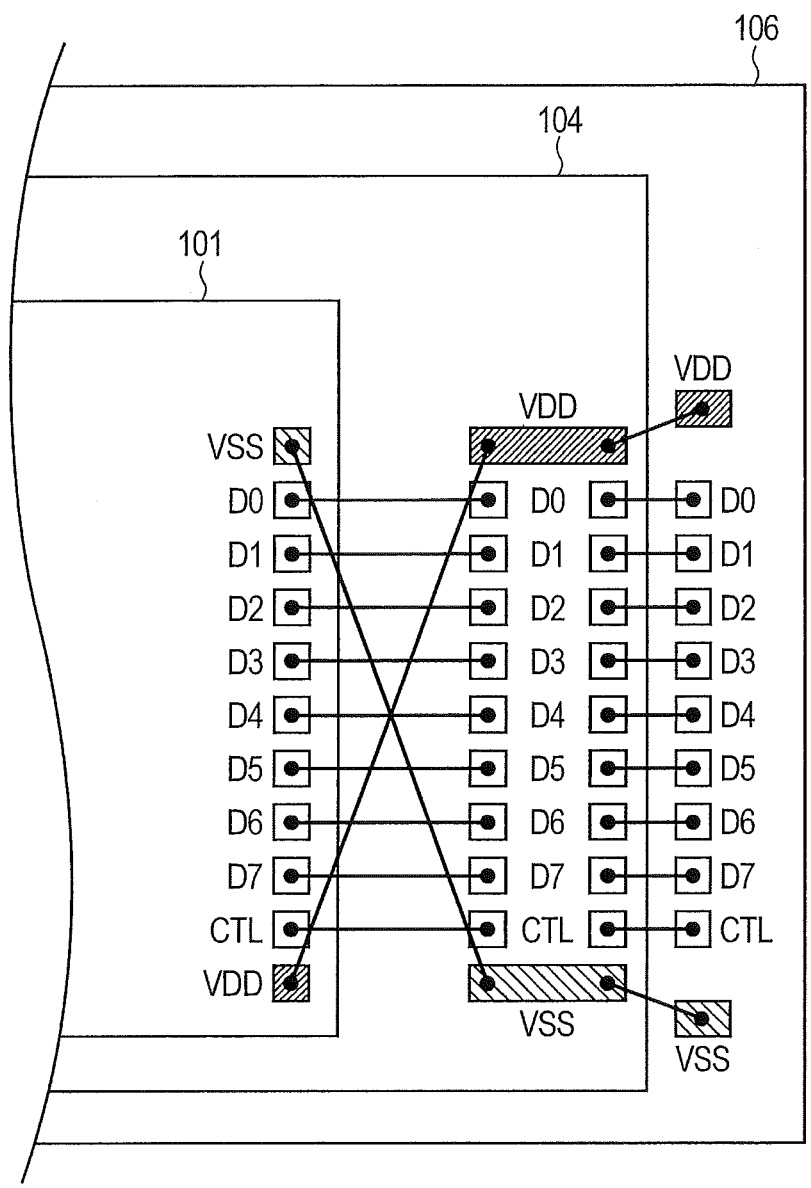
FIG. 4 is a diagram for explaining a semiconductor device as a comparative example 2 to be compared with the semiconductor device 1 according to the First Embodiment.

FIG. 4 is a diagram for explaining a semiconductor device as a comparative example 2 to be explained with the semiconductor device 1 according to the First Embodiment.

As a comparison with the semiconductor device of FIG. 3, FIG. 4 illustrates a case where the semiconductor chip 100 has been changed to a semiconductor chip 101.

As seen from this illustration, in the semiconductor chip 101, positions of the bonding pads corresponding to the voltages VDD and VSS differ from those of the semiconductor chip 100. Specifically, in the illustrated case, the positions of the bonding pads corresponding to the voltages VDD and VSS are switched. In the structure of the semiconductor device in the comparative example 2, the positional relationship of the bonding pad for the voltage VDD and the bonding pad for the voltage VSS has been changed. Thus, when the wire-bonding coupling is achieved in accordance with a normal technique, they cross other wires. In this structure, because the wires may possibly be short-circuited, some change needs to be made in the design. That is, to correspond to the signal array of the bonding pads of the semiconductor chip 101, it is necessary to change the signal arrays of the bonding pads of the semiconductor chip 104 and the package substrate 106 in accordance with the pattern of the semiconductor chip 101. This involves a change in the manufacturing processes, and causes an increase in the cost.

Figure 5:
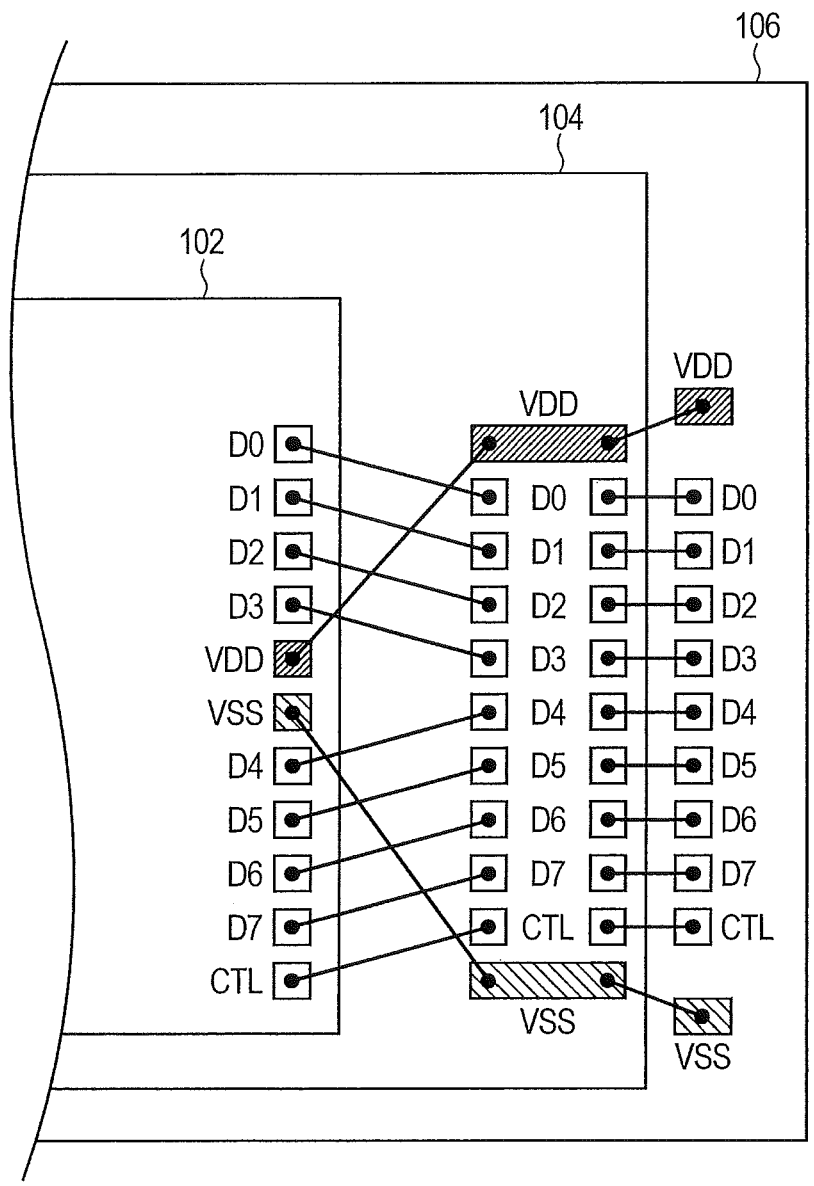
FIG. 5 is a diagram for explaining another semiconductor device as a comparative example 3 to be compared with the semiconductor device according to the First Embodiment.

FIG. 5 is a diagram for explaining another semiconductor device as a comparative example 3 to be compared with the semiconductor device 1 according to the First Embodiment.

As a comparison with the semiconductor device of FIG. 3, FIG. 5 illustrates a case where the semiconductor chip 100 has been changed to a semiconductor chip 102.

As illustrated, in the semiconductor chip 102, positions of the bonding pads for the voltages VDD and VSS differ from those of the semiconductor chip 100. Specifically, in the illustrated case, the bonding pads for the voltages VDD and VSS are provided near the center of one side of the semiconductor device 1.

In the structure of the semiconductor device in the comparative example 3, the positional relationship of the bonding pad for the voltage VDD and the bonding pad for the voltage VSS has been changed. Thus, if the wire-bonding coupling is made accordance with a normal technique, they cross other wires. In this structure, the wire may possibly be short-circuited. Thus, it is necessary to change the design. That is, to correspond to the signal array of the bonding pads of the semiconductor chip 102, it is necessary to change the signal arrays of the bonding pads of the semiconductor chip 104 and the package substrate 106 in accordance with the pattern of the semiconductor chip 102. This involves a change in the manufacturing process, and causes an increase in the cost.

Descriptions will now be made to a technique for wire-bonding coupling of the semiconductor device 1 according to the First Embodiment.

Figure 6:
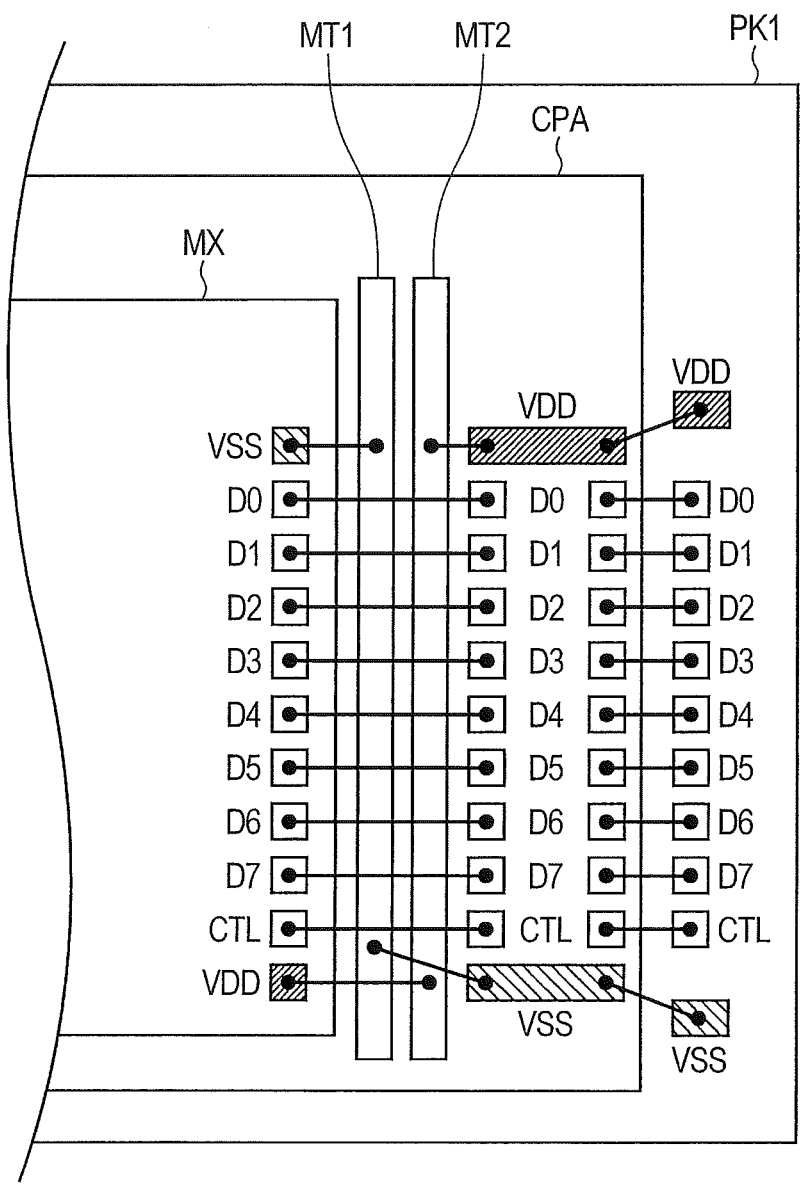
FIG. 6 is a diagram for explaining wire-bonding coupling of the semiconductor device according to the First Embodiment.

FIG. 6 is a diagram for explaining the wire-bonding coupling of the semiconductor device 1 according to the First Embodiment.

As illustrated in FIG. 6, the semiconductor chip MX includes bonding pads PD for voltages VDD and VSS, data D0 to D7, and a control signal CTL.

In this embodiment, the signal array is made along one side of the semiconductor chip, sequentially in the order of the voltage VSS, the data D0 to D7, the control signal CTL, and the voltage VDD. This semiconductor chip MX has the same signal array as that of the semiconductor chip 101.

The signal array of the bonding pads PD is the same signal array as that of the semiconductor chip CPA and the package substrate PK1. In the illustration, the signal array is the same as that of the semiconductor chips 104 and 106.

In this structure, the wire bonding coupling between the semiconductor chip CPA and the package substrate PK1 can be achieved by coupling the opposed corresponding bonding pads by wire.

The semiconductor chip CPA and the semiconductor chip MX are coupled by wire bonding through bonding pads for enabling relay coupling.

In this embodiment, two bonding pads MT1 and MT2, as bonding pads for enabling relay coupling, are arranged along the plurality of bonding pads PD arranged along one side of the semiconductor chip. The bonding pads MT1 and MT2 are used in a metal wiring layer on the same layer as that of the bonding pads for other signals. The bonding pads MT1 and MT2 are arranged parallelly along the plurality of bonding pads PD arranged along one side of the semiconductor chip.

In this embodiment, the bonding pad MT1 is used as a bonding pad for relaying the voltage VSS. The bonding pad MT2 is used as a bonding pad for relaying the voltage VDD.

Specifically, the bonding pad for the voltage VSS in the semiconductor chip is coupled to the bonding pad MT1 by wire bonding. The bonding pad MT1 is coupled to the bonding pad for the voltage VSS in the semiconductor chip CPA by wire bonding, and then coupled to the bonding pad for the voltage VSS corresponding to the package substrate PK1 by wire bonding.

It is possible to achieve the wiring coupling without crossing other wires, by achieving the wire-bonding coupling through the bonding pads for relaying.

The bonding pad for the voltage VDD in the semiconductor chip MX is coupled to the bonding pad MT2 by wire bonding. The bonding pad MT2 is coupled to the bonding pad for the voltage VDD in the semiconductor chip CPA by wire bonding, and then coupled to the bonding pad for the voltage VDD corresponding to the package substrate PK1 by wire bonding.

It is possible to achieve the wiring coupling without crossing other wires, by achieving the wire-bonding coupling through the bonding wire for relaying.

There is no need to make the wiring coupling in a state of crossing other wires (wire) by this wire bonding coupling, and it is possible to achieve the wiring coupling using a simple technique without changing the design.

The bonding pads MT1 and MT2 provided in the semiconductor chip CPA may be used in a metal wiring layer on the same layer as that of the bonding pads for other signals. Thus, there is no need to change (add) the manufacturing processes for manufacturing the bonding pads MT1 and MT2, and it is possible to suppress an increase in the cost and achieve the wire-bonding coupling using a simple technique.

Figure 7:
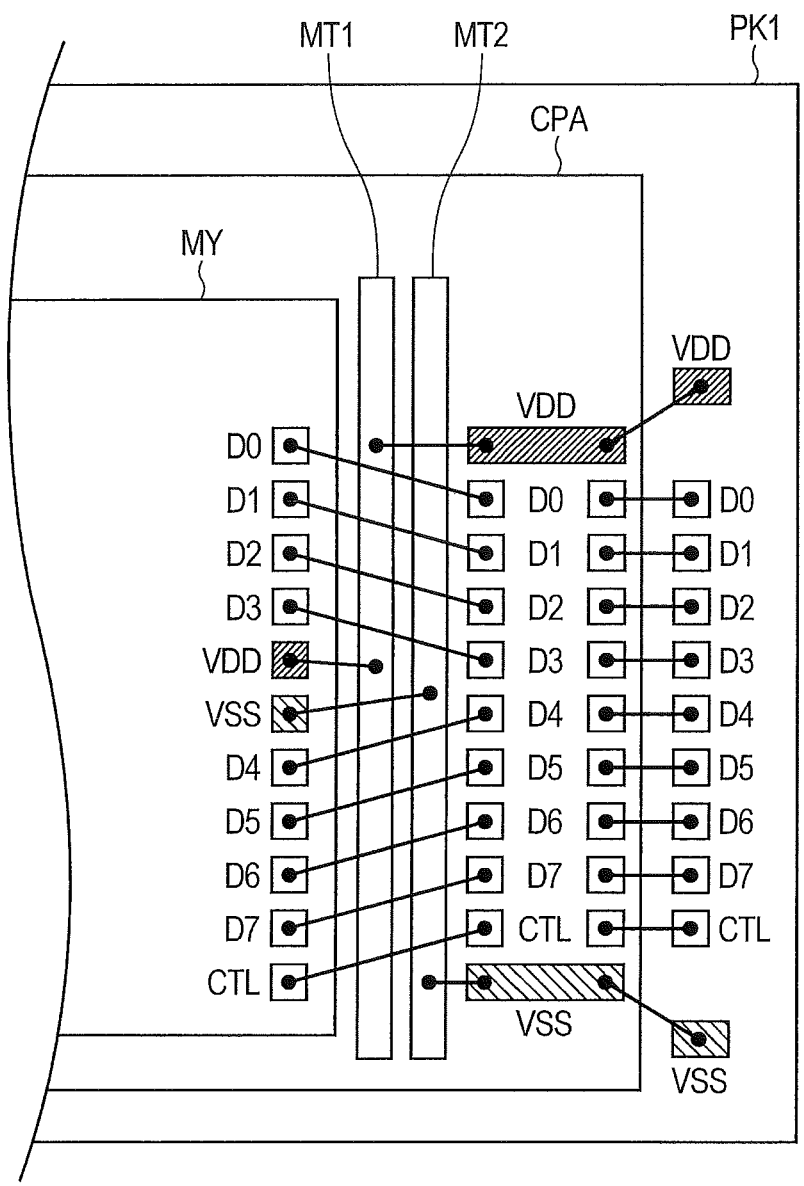
FIG. 7 is a diagram for explaining another wire-bonding coupling of the semiconductor device 1 according to the First Embodiment.

FIG. 7 is a diagram for explaining another wire-bonding coupling of the semiconductor device 1 according to this First Embodiment.

As illustrated in FIG. 7, a semiconductor chip MY includes bonding pads PD for voltages VDD and VSS, data D0 to D7, and a control signal CTL.

In this embodiment, the signal array is made along one side of the semiconductor chip, sequentially in the order of the data D0 to D3, the voltage VDD, the voltage VSS, the data D4 to D7, and the control signal CTL. This semiconductor chip MY has the same signal array as that of the semiconductor chip 102.

The signal array of the bonding pads PD is the same as that of the semiconductor chip CPA and the package substrate PK1. In the illustrated case, the, signal array is the same as that of the semiconductor chips 104 and 106.

In this structure, the wire-bonding coupling between the semiconductor chip CPA and the package substrate PK1 can be achieved by coupling the opposed corresponding bonding pads with each other by wire.

The semiconductor chip CPA and the semiconductor chip MX are coupled by wire bonding through the bonding pads for enabling relay coupling.

In this embodiment, as the bonding pads for enabling relay coupling, two bonding pads MT1 and MT2 are arranged along the plurality of bonding pads PD arranged along one side of the semiconductor chip.

In this embodiment, the bonding pad MT1 is used as a bonding pad for relaying the voltage VDD. The bonding pad MT2 is used as a bonding pad for relaying the voltage VSS.

Specifically, the bonding pad for the voltage VDD in the semiconductor chip MY is coupled to the bonding pad MT1 by wire bonding. The bonding pad MT1 is coupled to the bonding pad of the semiconductor chip CPA by wire bonding, and then coupled to the bonding pad for the voltage VDD of the package substrate PK1 by wire bonding.

It is possible to achieve wiring coupling without crossing other wires, by achieving the wire bonding coupling through the bonding pad for relaying.

The bonding pad for the voltage VSS of the semiconductor chip MY is coupled to the bonding pad MT2 by wire bonding. The bonding pad MT2 is coupled to the bonding pad for the voltage VSS of the semiconductor chip CPA by wire bonding, and then coupled to the bonding pad for the voltage VSS of the package substrate PK1 by wire bonding.

It is possible to achieve the wiring coupling without crossing other wires, by achieving the wire-bonding coupling through the bonding pad for relaying.

There is no need to make the wiring coupling in a state of crossing other wires by this wire-bonding coupling, and it is possible to achieve the wiring coupling using a simple technique without changing the design.

The bonding pads MT1 and MT2 provided in the semiconductor chip CPA may be used in a metal wiring layer on the same layer as that of the bonding pads for other signals. Thus, there is no need to change (add) the manufacturing processes for manufacturing the bonding pads MT1 and MT2, and it is possible to suppress an increase in the cost and achieve the wire-bonding coupling using a simple technique.

Modification

In the above, the descriptions have been made to the case where the two bonding pads MT1 and MT2 are used. However, this number is not limited to two, and a plurality of bonding pads can be used.

Figure 8:
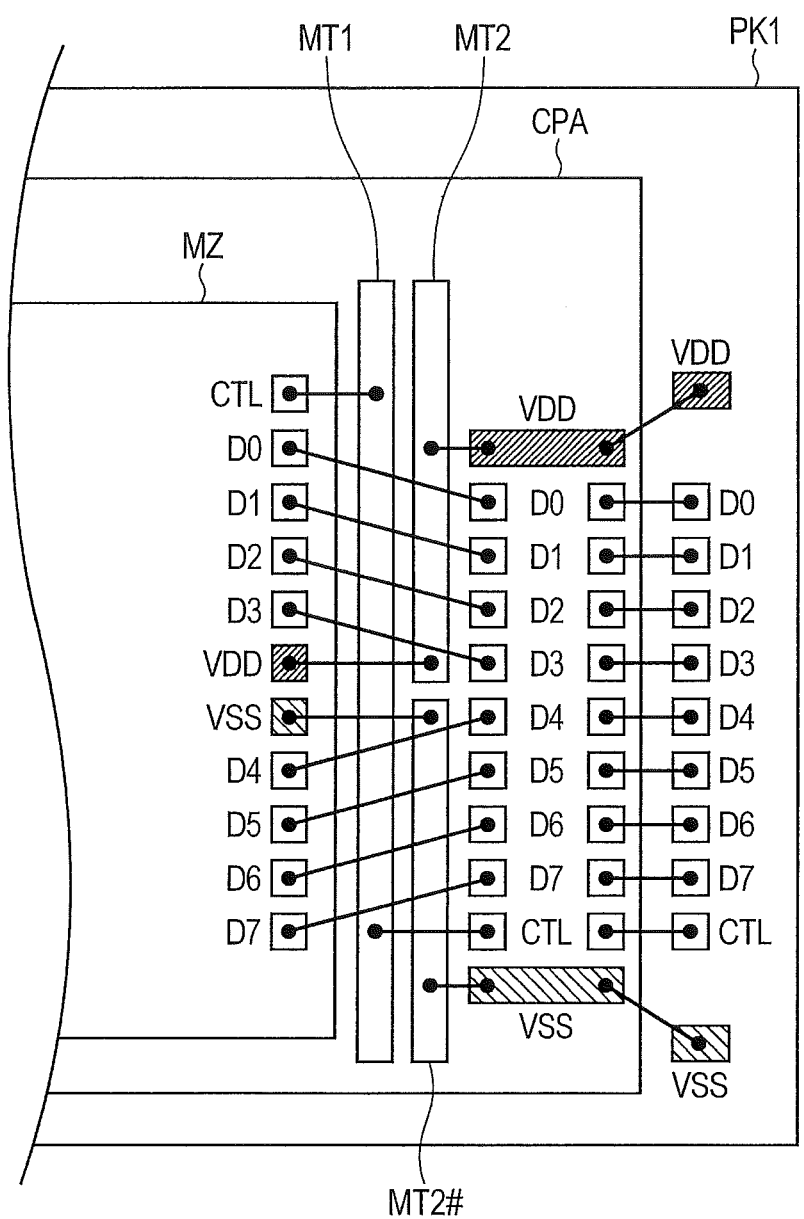
FIG. 8 is a diagram for explaining wire-bonding coupling of the semiconductor device 1 according to a modification of the First Embodiment.

FIG. 8 is a diagram for explaining the wire-bonding coupling of the semiconductor device 1 according to the modification of the First Embodiment.

As illustrated in FIG. 8, a semiconductor chip MZ includes bonding pads PD for voltages VDD and VSS, data D0 to D7, and a control signal CTL.

In this embodiment, the signal array is made along one side, sequentially in the order of the control signal CTL, the data D0 to D3, the voltage VDD, the voltage VSS, and the data D4 to D7.

In the illustrated case, the signal array of the bonding pads PD is the same as that in the semiconductor chip CPA and the package substrate PK1.

In this structure, the wire-bonding coupling between the semiconductor chip CPA and the package substrate PK1 can be achieved by coupling the opposed corresponding bonding pads with each other by wire.

The semiconductor chip CPA and the semiconductor chip MZ are coupled by wire bonding through bonding pads for enabling relay coupling.

In this embodiment, as bonding pads for enabling relay coupling, three bonding pads MT1, MT2, and MT2# are arranged along a plurality of bonding pads PD arranged along one side of the semiconductor chip. The bonding pads MT1, MT2, and MT2# are used in a metal wiring layer on the same layer as that of the bonding pads for other signals.

In this embodiment, the bonding pad MT1 is used as a bonding pad for relaying the control signal CTL. The bonding pad MT2 is used as a bonding pad for relaying the voltage VDD. The bonding pad MT2# is used as a bonding pad for relaying the voltage VSS.

Specifically, the bonding pad for the control signal CTL in the semiconductor chip MZ is coupled to the bonding pad MT1 by wire bonding. The bonding pad MT1 is coupled to the bonding pad for the control signal CTL in the semiconductor chip CPA by wire bonding. The bonding pad for the control signal CTL of the semiconductor chip CPA is coupled to the bonding pad for the control signal CTL corresponding to the package substrate PK1 by wire bonding.

The bonding pad for the voltage VDD in the semiconductor chip MZ is coupled to the bonding pad MT2 by wire bonding. The bonding pad MT2 is coupled to the bonding pad for the voltage VDD in the semiconductor chip CPA by wire bonding, and then coupled to the bonding pad for the voltage VDD corresponding to the package substrate PK1 by wire bonding.

The bonding pad for the voltage VSS in the semiconductor chip MZ is coupled to the bonding pad MT2# by wire bonding. The bonding pad MT2# is coupled to the bonding pad for the voltage VSS in the semiconductor chip CPA by wire bonding, and then coupled to the bonding pad for the voltage VSS corresponding to the package substrate PK1 by wire bonding.

It is possible to achieve the wiring coupling without crossing other wires, by making the wiring-bonding coupling through the bonding pad for relaying.

There is no need to make the wiring coupling in a state of crossing other wires by this wire-bonding coupling, and it is possible to achieve the wiring coupling using a simple technique without changing the design.

The bonding pads MT1, MT2, and MT2# provided in the semiconductor chip CPA may be used in a metal wiring layer on the same layer as that of the bonding pads for other signals. Thus, there is no need to change (add) the manufacturing processes for manufacturing the bonding pads MT1 and MT2, and it is possible to suppress an increase in the cost and achieve the wire-bonding coupled using a simple technique.

At this point, the bonding pads MT2 and MT2# are arranged in series along the plurality of bonding pads PD arranged along one side of the semiconductor chip.

In a manufacturing process, a region between the bonding pads MT2 and MT2# (an electrically insulated part) is masked not to form a metal layer. This enables easy formation of the bonding pads by the design without forming the metal layer in the masked part.

In this embodiment, the descriptions have been made to the case where the three bonding pads MT1, MT2, and MT2# are arranged along the plurality of bonding pads PD arranged along one side of the semiconductor chip. However, not limited to this, it is possible to arrange further more bonding pads.

Second Embodiment

In this above-described First Embodiment, the descriptions have been made to the case where the positions of the bonding pads for the voltages VDD and VSS of the semiconductor chip MX differ between the semiconductor chip CPA and the package substrate PK1. Descriptions will now be made to a case where the position of the bonding pad for the control signal CTL differs from those in the semiconductor chip CPA and the package substrate PK1.

Figure 9:
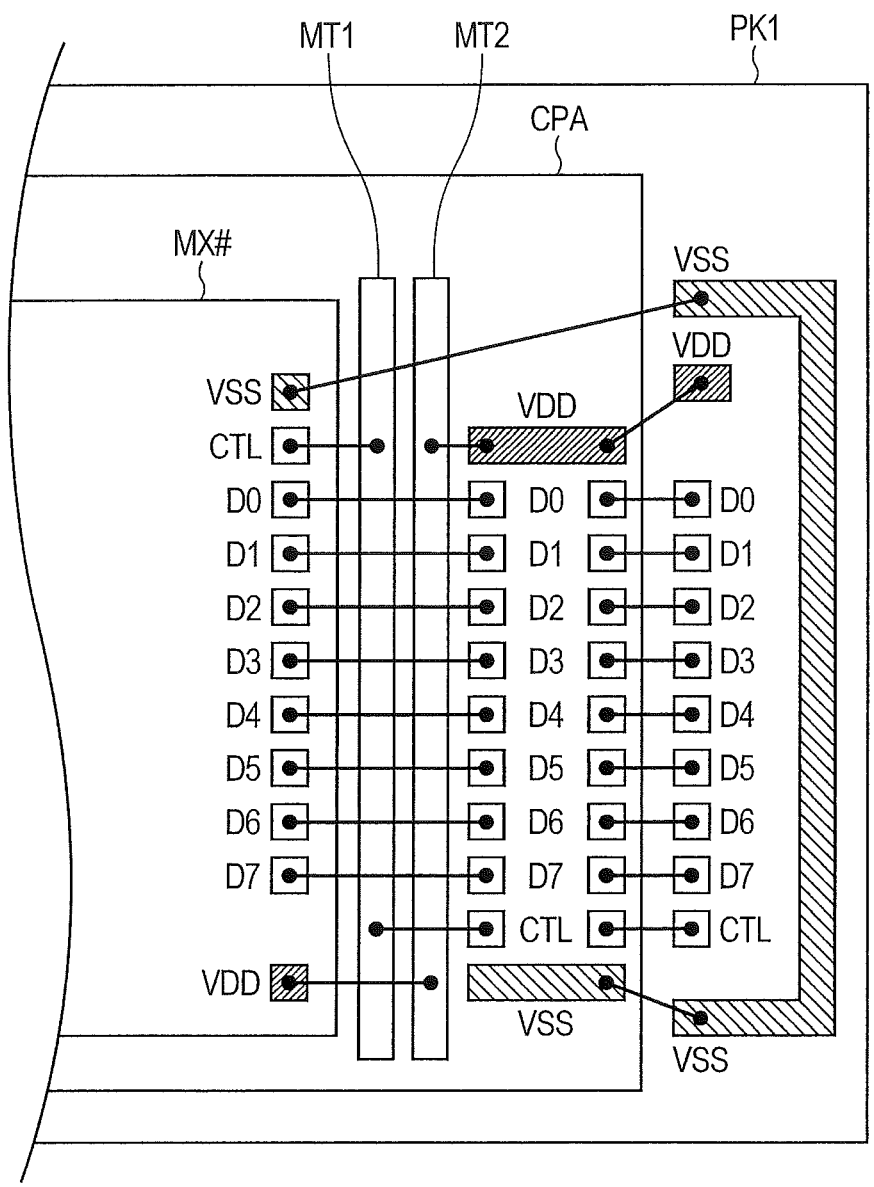
FIG. 9 is a diagram for explaining wire-bonding coupling of the semiconductor device 1 according to a Second Embodiment.

FIG. 9 is a diagram for explaining the wire-bonding coupling of the semiconductor device 1 according to the Second Embodiment.

As illustrated in FIG. 9, the semiconductor chip MX# includes bonding pads PD for voltages VDD and VSS, data D0 to D7, and a control signal CTL.

In this embodiment, the signal array is made along one side, sequentially in the order of the voltage VSS, the control signal CTL, the data D0 to D7, and the voltage VDD.

The signal array of the bonding pads PD is substantially the same as that in the semiconductor chip CPA and the package substrate PK1, and also the same as that of the semiconductor chips 104 and 106.

In this structure, the wire-bonding coupling between the semiconductor chip CPA and the package substrate PK1 can be achieved by coupling the opposed corresponding bonding pads with each other by wire.

The semiconductor chip CPA and the semiconductor chip MX# are coupled with each other by wire, through bonding pads for enabling relay coupling.

In this embodiment, as bonding pads for enabling relay coupling, two bonding pads MT1 and MT2 are arranged along the plurality of bonding pads PD.

The bonding pad MT1 is used as a bonding pad for relaying the control signal CTL. The bonding pad MT2 is used as a bonding pad for relaying the voltage VDD.

In the illustrated case, for the wire-bonding coupling with the bonding pad for the voltage VSS of the semiconductor chip MX#, on the side of the package substrate PK1, the coupling is made by extending the bonding pad, for enabling the wire-bonding coupling with the semiconductor chip MX# in a position not crossing other wires.

The bonding pad for the control signal CTL of the semiconductor chip MX# is coupled to the bonding pad MT1 by wire bonding, while the bonding pad MT1 is coupled to the bonding pad for the control signal CTL of the package substrate PK1 by wire bonding.

The bonding pad for the voltage VDD of the semiconductor chip MX# is coupled to the bonding pad MT2 by wire bonding, while the bonding pad MT2 is coupled to the bonding pad for the voltage VDD of the package substrate PK1 by wire bonding.

There is no need to make the wiring coupling while crossing other wires by the wire bonding coupling, and it is possible to achieve the wiring coupling using a simple technique without changing the design.

In this structure, because the arrangements of the three bonding pads for the voltages VDD and VSS and the control signal CTL of the semiconductor chip MX# differ from one another, three bonding pads are necessary for enabling the relay coupling. However, by extending the bonding pad for the voltage VSS in the package substrate PK1, it is possible to suppress an increase in the cost and achieve the wire-bonding coupling using a simple technique, without performing an additional manufacturing process.

Modification

Figure 10:
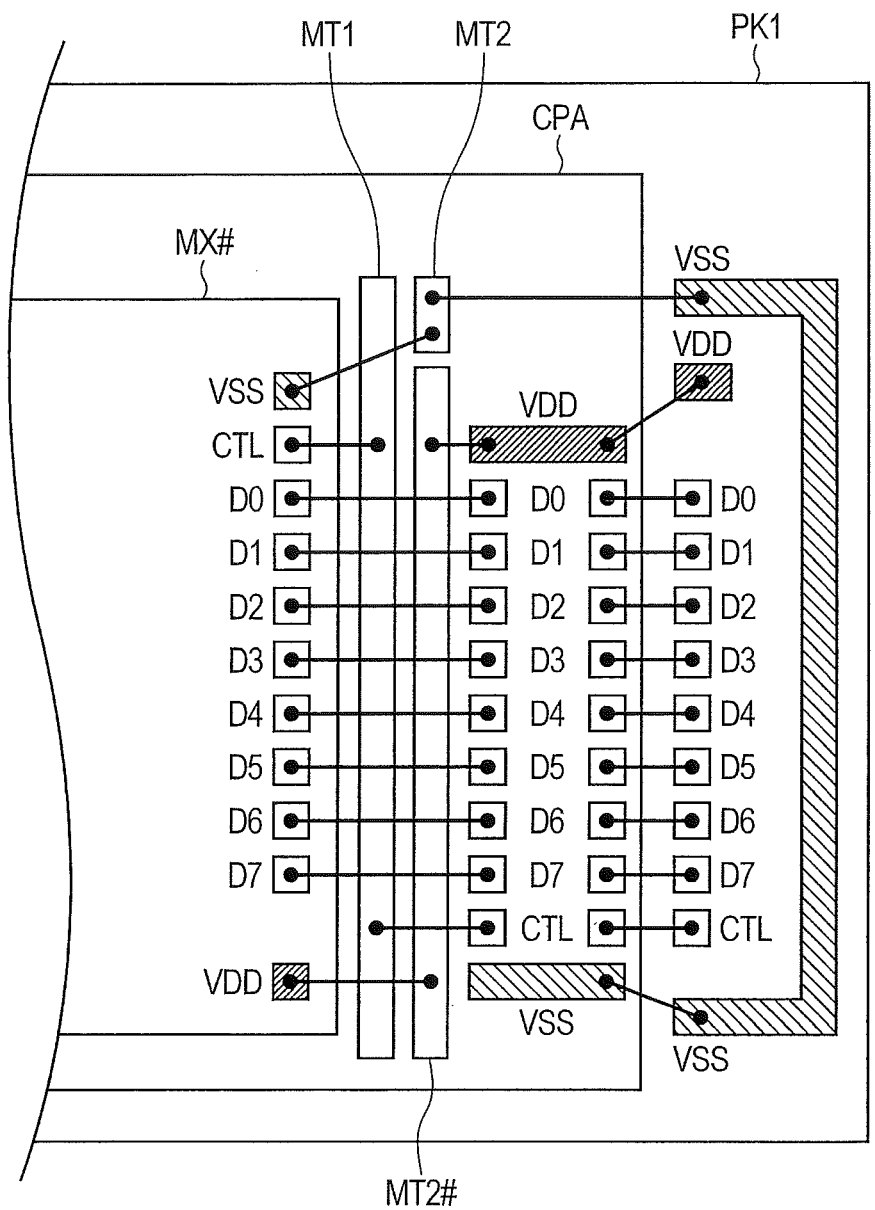
FIG. 10 is a diagram for explaining wire-bonding coupling of a semiconductor device 1 according to a modification of the Second Embodiment.

FIG. 10 is a diagram for explaining the wire-bonding coupling of the semiconductor device 1 according to a modification of the Second Embodiment.

As illustrated in FIG. 10, the semiconductor chip MX# includes bonding pads PD for voltages VDD and VSS, data D0 to D7, and a control signal CTL.

In this embodiment, the signal array is made along one side, sequentially in the order of the voltage VSS, the control signal CTL, the data D0 to D7, and the voltage VDD.

In the illustrated case, the signal array of the bonding pads PD is substantially the same signal array in the semiconductor chip CPA and the package substrate PK1, and is the same as that in the semiconductor chips 104 and 106.

In this structure, the wire-bonding coupling of the semiconductor chip CPA and the package substrate PK1 can be achieved by coupling the opposed corresponding bonding pads by wire.

The semiconductor chip CPA and the semiconductor chip MX# are coupled by wire bonding through bonding pads for enabling relay coupling.

In this embodiment, as bonding pads for enabling relay coupling, three bonding pads MT1, MT2, and MT2# are arranged along a plurality of bonding pads PD.

The bonding pad MT1 is used as a bonding pad for relaying the control signal CTL. The bonding pad MT2 is used as a bonding pad for relaying the voltage VSS. The bonding pad MT2# is used as a bonding pad for relaying the voltage VDD.

The bonding pad for the control signal CTL of the semiconductor chip MX# is coupled to the bonding pad MT1 by wire bonding. The bonding pad MT1 is coupled to the bonding pad for the control signal CTL of the semiconductor chip by wire bonding, and then coupled to the bonding pad for the control signal CTL of the package substrate PK1 by wire bonding.

The bonding pad for the voltage VDD of the semiconductor chip MX# is coupled to the bonding pad MT2# by wire bonding. The bonding pad MT2# is coupled to the bonding pad for the voltage VDD of the semiconductor chip by wire bonding, and then coupled to the bonding pad for the voltage VDD of the package substrate PK1 by wire bonding.

The bonding pad for the voltage VSS of the semiconductor chip MX# is coupled to the bonding pad MT2 by wire bonding. The bonding pad MT2 is coupled to the bonding pad for the voltage VSS of the semiconductor chip by wire bonding, and then coupled to the bonding pad for the voltage VSS of the package substrate PK1 by wire bonding.

There is no need to make the wiring coupling in a state of crossing other wires by this wire bonding coupling, and it is possible to achieve the wiring coupling using a simple technique without changing the design. The bonding pads MT1, MT2, and MT2# provided in the semiconductor chip CPA may be used the metal wiring layer on the same layer as the bonding pads for other signals. Thus, there is no need to change (add) the manufacturing processes for manufacturing the bonding pads MT1 and MT2, and it is possible to suppress an increase in the cost and make the wire-bonding coupling using a simple technique.

As compared with the structure of the above Second Embodiment, there is no need to make the wire coupling directly between the bonding pad for the voltage VSS of the semiconductor chip MX# and the bonding pad for the voltage VSS of the package substrate PK1. The relaying is done through the bonding pad MT2. Thus, it enables to shorten the wire length and facilitates the loop control.

Third Embodiment

The above descriptions have been made to the case where the positions of the bonding pads for the voltages VDD and VSS of the semiconductor chip MX stacked on the upper layer differ from the semiconductor chip CPA and the package substrate PK1. In the Third Embodiment, descriptions will now be made to a case where positions of the bonding pads of the semiconductor chip are different from others, in the intermediate position.

Figure 11:
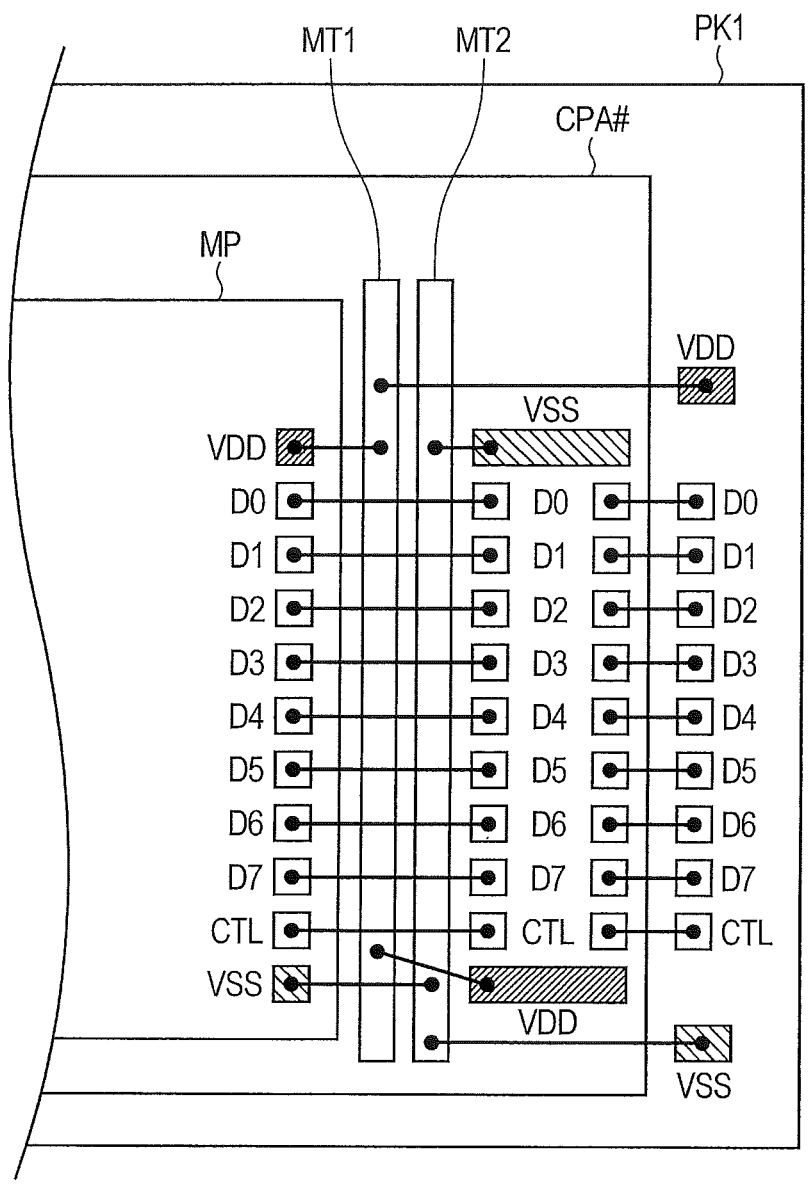
FIG. 11 is a diagram for explaining wire-bonding coupling of a semiconductor device 1 according to a Third Embodiment.

FIG. 11 is a diagram for explaining the wire-bonding coupling of the semiconductor device 1 according to the Third Embodiment.

As illustrated in FIG. 11, a semiconductor chip MP includes bonding pads PD for voltages VDD and VSS, data D0 to D7, and a control signal CTL.

In this embodiment, the signal array is made along one side, sequentially in the order of the voltage VDD, the data D0 to D7, the control signal CTL, the voltage VSS.

In the illustrated case, the signal array of the bonding pads PD is the same signal array in the semiconductor chip MP and the package substrate PK1, but the signal array of a semiconductor chip CPA# is different therefrom.

The semiconductor chip CPA# includes bonding pads PD for voltages VDD and VSS, data D0 to D7, and a control signal CTL.

In this embodiment, the signal array is made along one side, sequentially in the order of the voltage VSS, the data D0 to D7, the control signal CTL, and the voltage VDD.

In this structure, the wire-bonding coupling between the semiconductor chip CPA# and the package substrate PK1 can be achieved by coupling the opposed corresponding bonding pads.

The wire-bonding coupling between the semiconductor chip CPA# and the semiconductor chip MP can be achieved by coupling the opposed corresponding bonding pads with each other.

A part of the bonding pads are coupled by wire bonding through the bonding pads for enabling relay coupling.

In this embodiment, as the bonding pads for enabling relaying, two bonding pads MT1 and MT2 are arranged along the plurality of bonding pads PD.

The bonding pad MT1 is used as a bonding pad for relaying the voltage VDD. The bonding pad MT2 is used as a bonding pad for relaying a voltage VSS.

Specifically, the bonding pad for the voltage VDD in the semiconductor chip MP is coupled to the bonding pad MT1 by wire bonding. The bonding pad MT1 is coupled to the bonding pad for the voltage VDD of the semiconductor chip CPA# by wire bonding, and then coupled to a corresponding bonding pad for the voltage VDD in the package substrate PK1 by wire bonding.

The bonding pad for the voltage VSS in the semiconductor chip MP is coupled to the bonding pad MT2 by wire bonding. The boding pad MT2 is coupled to the bonding pad for the voltage VDD in the package substrate PK1 by wire bonding, and then coupled to a corresponding bonding pad for the voltage VSS in the semiconductor chip CPA# by wire bonding.

There is no need to make the wiring coupling in the state of crossing other wires by the wire-bonding coupling, and it is possible to achieve the wiring coupling using a simple technique without changing the design.

The bonding pads MT1 and MT2 provided in the semiconductor chip CPA may be used in the metal wiring layer on the same layer as those bonding pads for other signals. Thus, this is no need to change (add) the manufacturing processes for manufacturing the bonding pads MT1 and MT2, and it is possible to suppress an increase in the cost and achieve the wire-bonding coupling using a simple technique.

The above descriptions have been made to a stack type SIP in which the first and second semiconductor devices are stacked onto the package substrate. However, it is not limited to the stack type SIPs, and is applicable similarly to planar arranged SIPs arranged on the same plane or SIPs using any of these.

In the above-described embodiments, the descriptions have been made to the case where mainly two bonding pads MT1 and MT2 are arranged along one side of the semiconductor chip. However, one bonding pad is possible, or a plurality of bonding pads is possibly provided. The bonding pads may be provided along one side out of four sides of the semiconductor chip, or may be provided respectively along the sides thereof.

In the embodiments, the descriptions have been made to the structure in which bonding pads for relaying are arranged between the plurality of bonding pads of the first semiconductor chip and the plurality of bonding pads of the second semiconductor chip. However, it is not limited to this structure. For example, in a possible structure, the bonding pads for relaying may be arranged between the plurality of bonding pads of the package substrate and the plurality of bonding pads of the second semiconductor chip, and its arrangement is not particularly limited.

Accordingly, the inventions of the present inventors have specifically been described based on the preferred embodiments. However, the present invention is not limited to the preferred embodiments, and, needless to say, various changes may be made thereto without departing from the scope of the subject matter.

What is claimed is:

1. A semiconductor device comprising:
   a first semiconductor and second semiconductor chips mounted over a package substrate, and
   wherein the first semiconductor chip includes a plurality of first bonding pads which are arranged along one side of the first semiconductor chip, and
   the second semiconductor chip includes
   a plurality of second bonding pads which are arranged along one side of the second semiconductor chip and for coupling respectively to the first bonding pads by wire-bonding coupling and
   at least one third bonding pad for enabling relay coupling of a corresponding second bonding pad to at least one predetermined first bonding pad which is arranged along the second bonding pads and included in the first bonding pads without crossing another wire in the wire-bonding coupling.

2. The semiconductor device according to claim 1, wherein each of the first bonding pads includes a signal pad.

3. The semiconductor device according to claim 1, comprising:
   a first and second semiconductor chips mounted over a package substrate, and
   wherein the first semiconductor chip includes the first bonding pads arranged along one side of the first semiconductor chip,
   the package substrate is arranged along one side of the substrate, and includes second bonding pads to be coupled to the first bonding pads by wire-bonding coupling, and
   the second semiconductor chip includes at least one third bonding pad for enabling relay coupling of a corresponding second bonding pad by wire-bonding coupling to at least one predetermined first bonding pad arranged along the second bonding pads and included in the first bonding pads without crossing another wire in the wire-bonding coupling.

4. The semiconductor device according to claim 2, wherein each of the first bonding pads includes a power source pad.

5. The semiconductor device according to claim 1, wherein the at least one third bonding pad is arranged between the first bonding pads and the second bonding pads.

6. The semiconductor device according to claim 1, wherein the third bonding pad includes the third bonding pads, and
   the third bonding pads are arranged parallelly along the second bonding pads.

7. The semiconductor device according to claim 1, wherein the third bonding pad includes the third bonding pads, and
   the third bonding pads are arranged in series along the second bonding pads.

8. The semiconductor device according to claim 1, wherein the first semiconductor chip includes a memory chip having a storage cell storing data.

9. The semiconductor device according to claim 1, wherein the second semiconductor chip includes a logical chip having a logic circuit.

* * * * *